(12) United States Patent
Kuczynski (10) Patent No.: US 7,462,506 B2
(45) Date of Patent: Dec. 9, 2008

(54) CARBON DIOXIDE GETTERING METHOD FOR A CHIP MODULE ASSEMBLY

(75) Inventor: Joseph Kuczynski, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 11/424,250

(22) Filed: Jun. 15, 2006

(65) Prior Publication Data
US 2007/0290338 A1  Dec. 20, 2007

(51) Int. Cl.
*H01L 21/00* (2006.01)
(52) U.S. Cl. ............... 438/58; 438/143; 257/682
(58) Field of Classification Search ............ 438/57, 438/58, 143, 310, 402, 471, 59; 257/682, 257/E23.137
See application file for complete search history.

(56) References Cited

U.S. PATENT DOCUMENTS 6,972,249 B2   12/2005   Akram et al.
7,160,368 B1 *  1/2007   Wakelin ............ 96/132

OTHER PUBLICATIONS

Mulloth et al., "Carbon Dioxide Adsorption on a 5A Zeolite Designed for CO2 Removal in Spacecraft Cabins", NASA/TM-1998-208752, Nov. 1998.
Jessop et al., "Reversible nonpolar-to-polar solvent", Nature, vol. 436, p. 1102, Aug. 25, 2005.

* cited by examiner

*Primary Examiner*—David Vu
*Assistant Examiner*—Thinh T Nguyen
(74) *Attorney, Agent, or Firm*—Matthew J. Bussan (57) ABSTRACT

A chip module assembly includes a $CO_2$ getter exposed through a gas-permeable membrane to a chip cavity of a chip module. One or more chips is/are enclosed within the cavity. The $CO_2$ getter comprises a liquid composition including 1,8-diaza-bicyclo-[5,4,0]-undec-7-ene (DBU) in a solvent that includes an alcohol, preferably, 1-hexanol. In one embodiment, a sheet of gas-permeable membrane is heat-welded to form a pillow-shaped bag in which the liquid composition is sealed. The pillow-shaped bag containing the liquid composition is preferably disposed in a recess of a heat sink and exposed to the cavity through a passage between the recess and the cavity. The $CO_2$ getter can remove a relatively large amount of carbon dioxide from the cavity, and thus effectively prevents solder joint corrosion. For example, based on the formula weights and densities of the DBU and 1-hexanol, 200 g of the liquid composition can remove over 34 g of carbon dioxide.

8 Claims, 8 Drawing Sheets

CARBON DIOXIDE GETTERING METHOD FOR A CHIP MODULE ASSEMBLY

BACKGROUND OF THE INVENTION

1. Field of Invention

The present invention relates in general to the field of electronic packaging. More particularly, the present invention relates to electronic packaging that provides carbon dioxide gettering for a chip module assembly.

2. Background Art

Electronic components, such as microprocessors and integrated circuits, are generally packaged using electronic packages (i.e., modules) that include a module substrate to which one or more electronic component(s) is/are electronically connected. A single-chip module (SCM) contains a single electronic component such as a central processor unit (CPU), memory, application-specific integrated circuit (ASIC) or other integrated circuit. A multi-chip module (MCM), on the other hand, contains two or more such electronic components.

Generally, each of these electronic components takes the form of a flip-chip, which is a semiconductor chip or die having an array of spaced-apart terminals or pads on its base to provide base-down mounting of the flip-chip to the module substrate. The module substrate is typically a ceramic carrier or other conductor-carrying substrate.

Controlled collapse chip connection (C4) solder joints (also referred to as "solder bumps") are typically used to electrically connect the terminals or pads on the base of the flip-chip with corresponding terminals or pads on the module substrate. C4 solder joints are disposed on the base of the flip-chip in an array of minute solder balls (e.g., on the order of 100 μm diameter and 200 μm pitch). The solder balls, which are typically lead (Pb)-containing solder, are reflowed to join (i.e., electrically and mechanically) the terminals or pads on the base of the flip-chip with corresponding terminals or pads on the module substrate.

Typically, a non-conductive polymer underfill is disposed in the space between the base of the flip-chip and the module substrate and encapsulates the C4 solder joints. The C4 solder joints are embedded in this polymeric underfill and are thus protected from corrosion caused by moisture and carbon dioxide in the air. However, as discussed below, the use of the polymeric chip underfill disadvantageously renders the assembled flip-chip(s)/module substrate un-reworkable.

Figure 1:
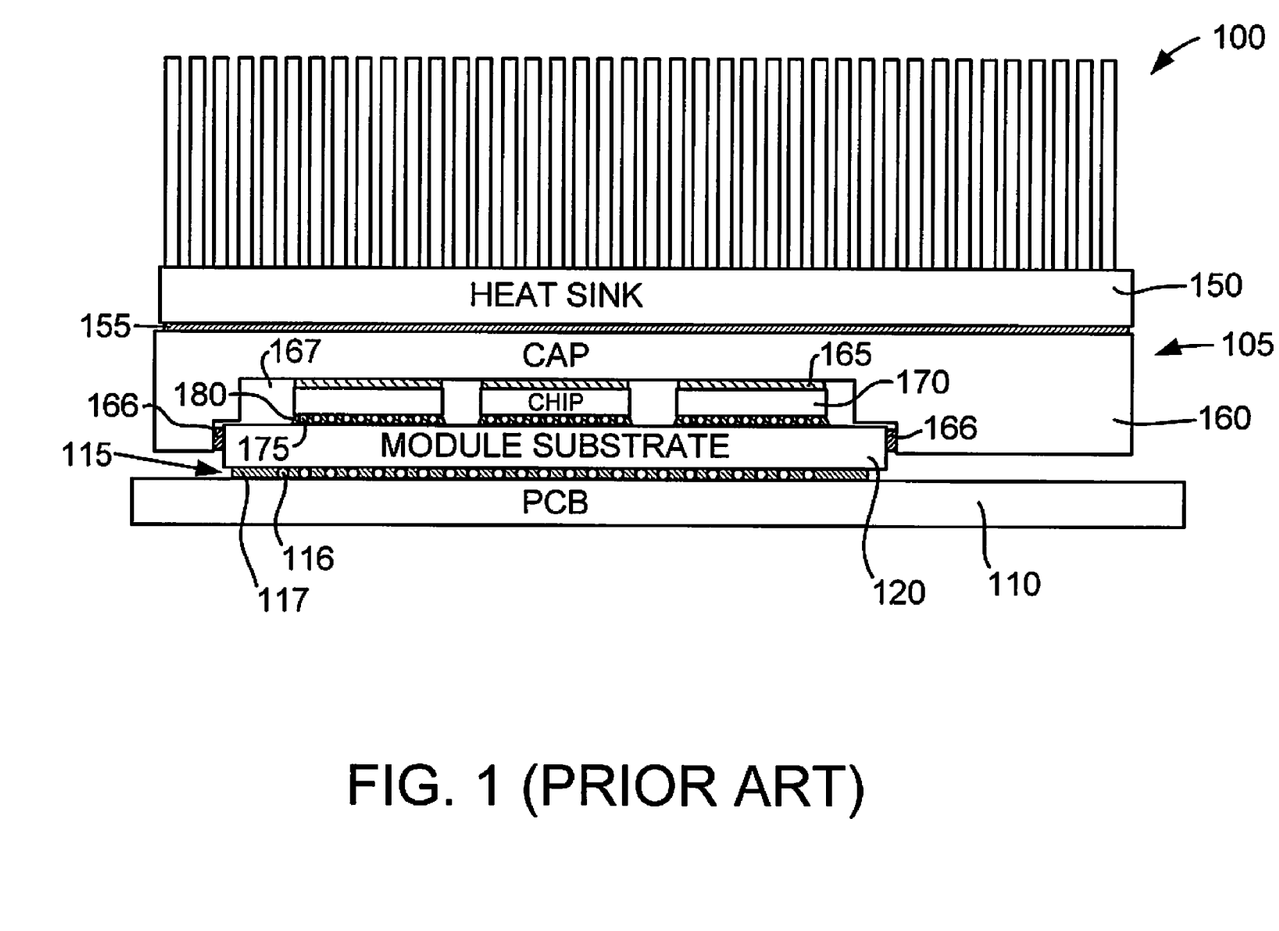
FIG. 1 is a sectional view of a conventional multi-chip module assembly that utilizes C4 solder joints and a polymeric chip underfill.
Figure 2:
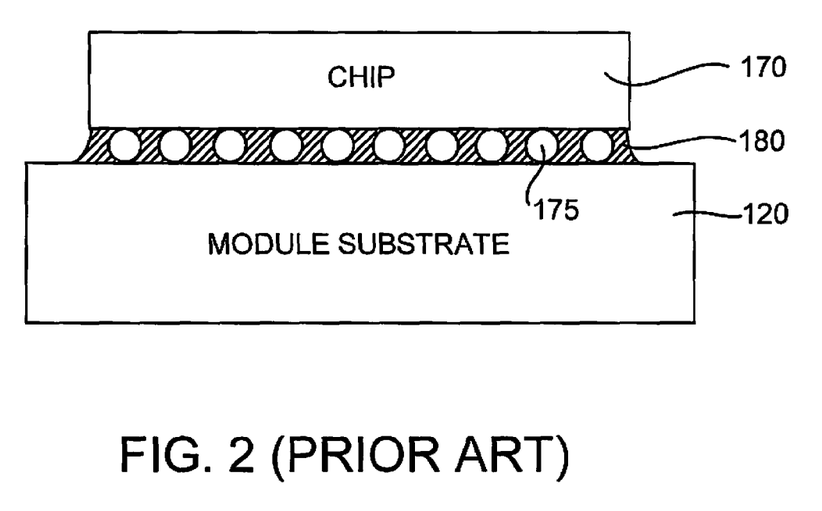
FIG. 2 is an enlarged sectional view of the C4 solder joints and the polymeric chip underfill of the conventional multi-chip module assembly shown in FIG. 1.

FIG. 1 illustrates an example of a conventional multi-chip module assembly 100 that utilizes C4 solder joints and a polymeric chip underfill. FIG. 2 is an enlarged view of the C4 solder joints and the polymeric chip underfill of the conventional multi-chip module assembly 100. In many computer and other electronic circuit structures, an electronic module is electrically connected to a printed circuit board (PCB). For example, the conventional multi-chip module assembly 100 shown in FIGS. 1 and 2 includes capped module 105 electrically connected to a PCB 110. Generally, in connecting an electronic module to a PCB, a plurality of individual electrical contacts on the base of the electronic module must be connected to a plurality of corresponding individual electrical contacts on the PCB. Various technologies well known in the art are used to electrically connect the set of contacts on the PCB and the electronic module contacts. These technologies include land grid array (LGA), ball grid array (BGA), column grid array (CGA), pin grid array (PGA), and the like. In the illustrative example shown in FIG. 1, a LGA 115 electrically connects PCB 110 to a module substrate 120. LGA 115 may comprise, for example, conductive elements 116, such as fuzz buttons, retained in a non-conductive interposer 117.

In some cases, the module includes a cap (i.e., a capped module) which seals the electronic component(s) within the module. The module 105 shown in FIG. 1 is a capped module. In other cases, the module does not include a cap (i.e., a bare die module). In the case of a capped module, a heat sink is typically attached with a thermal interface between a bottom surface of the heat sink and a top surface of the cap, and another thermal interface between a bottom surface of the cap and a top surface of the electronic component(s). For example, as shown in FIG. 1, a heat sink 150 is attached with a thermal interface 155 between a bottom surface of heat sink 150 and a top surface of a cap 160, and another thermal interface 165 between a bottom surface of cap 160 and a top surface of each flip-chip 170. In addition, a heat spreader (not shown) may be attached to the top surface of each flip-chip 170 to expand the surface area of thermal interface 165 relative to the surface area of the flip-chip 170. The heat spreader, which is typically made of a highly thermally conductive material such as SiC, is typically adhered to the top surface of the flip-chip 170 with a thermally-conductive adhesive. Typically, a sealant 166 (e.g., a silicone adhesive such as Sylgard 577) is applied between cap 160 and module substrate 120 to seal the chip cavity 167. In the case of a bare die module, a heat sink is typically attached with a thermal interface between a bottom surface of the heat sink and a top surface of the electronic component(s). Heat sinks are attached to modules using a variety of attachment mechanisms, such as adhesives, clips, clamps, screws, bolts, barbed push-pins, load posts, and the like.

Capped module 105 includes a module substrate 120, a plurality of flip-chips 170, LGA 115, and cap 160. In addition, capped module 105 includes C4 solder joints 175 electrically connecting each flip-chip 170 to module substrate 120. As best seen in FIG. 2, capped module 110 also includes a non-conductive polymer underfill 180 which is disposed in the space between the base of each flip-chip 170 and module substrate 120 and encapsulates the C4 solder joints 175. C4 solder joints 175 are embedded in polymeric underfill 180 and, thus, as mentioned above, are protected from moisture and carbon dioxide in the air. Without polymeric chip underfill 180, the solder balls of C4 solder joints 175 would corrode, and electrically short neighboring solder balls. Atmospheric carbon dioxide is the primary factor controlling corrosion of the Pb-containing solder balls of C4 solder joints 175, presumably through a series of reaction steps known as the "Dutch reaction". The Dutch reaction is initiated by the oxidation of lead in the presence of $O_2$ and $H_2O$ to form lead hydroxide. Lead hydroxide and acetic acid react in two steps to form basic lead acetate. Decomposition of basic lead acetate by $CO_2$ regenerates lead acetate and $H_2O$ so the reaction can proceed again. The reaction is autocatalytic as long as $O_2$ and $CO_2$ are available. Over time, $CO_2$, $O_2$ and moisture seep into chip cavity 167 (e.g., through sealant 166). Polymeric chip underfill 180 protects C4 solder joints 175 but, unfortunately, renders the assembled flip-chips 170/module substrate 120 un-reworkable. Generally, it is preferable to use technologies that provide reworkability. However, the use of polymeric chip underfill 180 stands as an obstacle to reworkability and, thus, increases the cost of manufacturing and maintenance.

Figure 3:
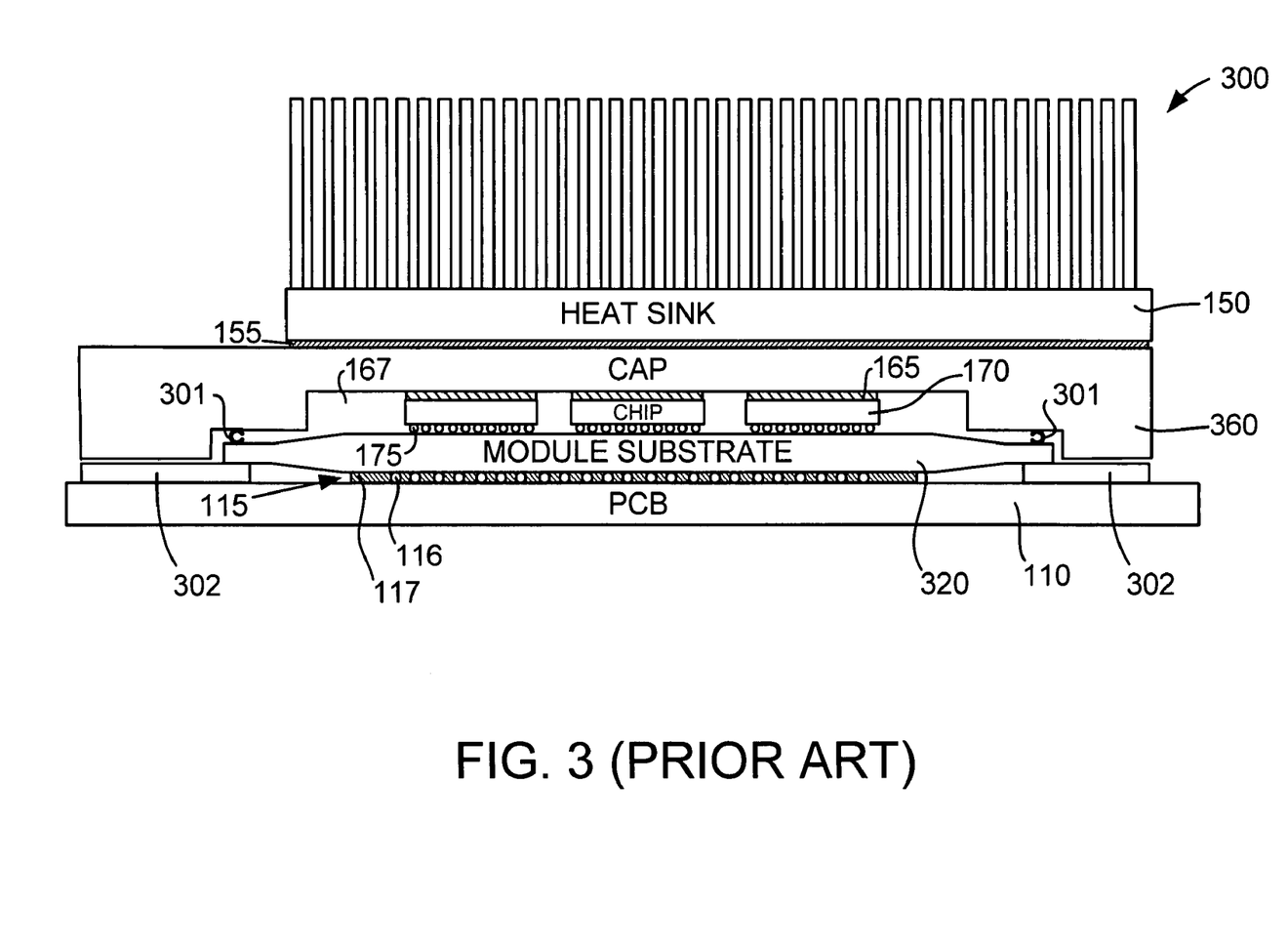
FIG. 3 is a sectional view of a proposed multi-chip module assembly that utilizes C4 solder joints and a C-ring seal.

Two approaches have been proposed to simultaneously address the issue of C4 solder joint corrosion as well as the desire to provide reworkability. FIG. 3 illustrates an example of such an approach in a proposed multi-chip module assembly 300 that utilizes a C-ring seal 301, which is interposed between a module substrate 320 and a cap 360. A non-conductive frame 302 is mounted between PCB 110 and the periphery of module substrate 320. Unfortunately, C-ring seal 301 requires a larger module substrate 320 and a larger cap 360 (compared to module substrate 120 and cap 160 shown in FIG. 1) and, thus, results in the loss of precious PCB real estate (i.e., the larger footprint of module substrate 320 and cap 360 occupies a larger area on PCB 110) as well as increased manufacturing cost.

Figure 4:
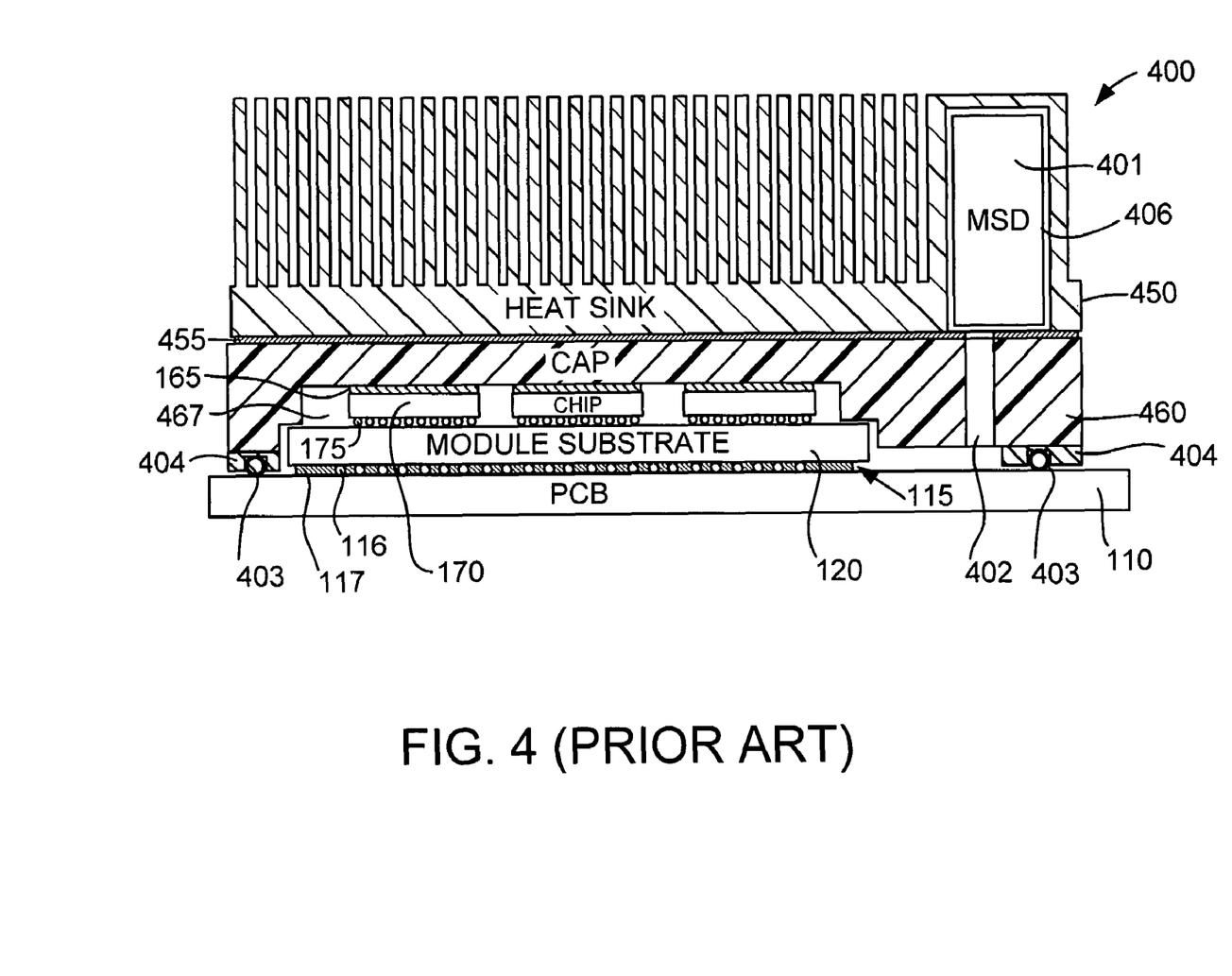
FIG. 4 is a sectional view of a proposed multi-chip module assembly that utilizes C4 solder joints and a molecular sieve desiccant.
Figure 5:
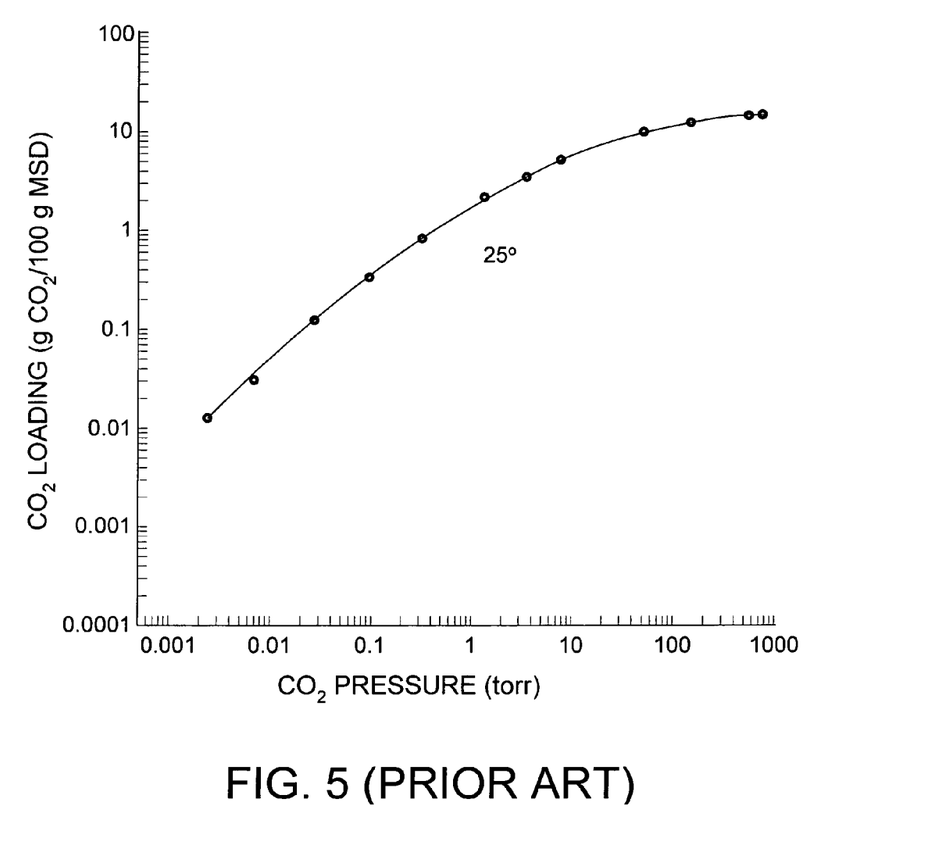
FIG. 5 is a graph of carbon dioxide loading in the molecular sieve desiccant as a function of carbon dioxide pressure at room temperature for the proposed multi-chip module assembly shown in FIG. 4.

FIG. 4 illustrates an example of a second approach in a proposed multi-chip module assembly 400 that utilizes a molecular sieve desiccant (MSD) 401. MSD 401 is exposed through a passage 402 to a module cavity 467, which encloses C4 solder joints 175 as well as LGA 115. Passage 402 extends from a recess in heat sink 450, through a thermal interface 455 and a cap 460, and into module cavity 467. MSD 401 is a solid sorbent media, e.g., 5A zeolite available from UOP, LLC (Des Plaines, Ill.). Module cavity 467 is sealed using a rubber gasket 403 seated in a non-conductive frame 404 interposed between cap 460 and PCB 110. Typically, a total of about 200 gm of MSD is provided in one or more cartridges 406 and exposed to module cavity 467 to remove moisture and carbon dioxide therefrom. A drawback to this approach is that the MSD merely absorbs the carbon dioxide and, consequently, has a limited capacity. This is a significant drawback because MSD has relatively low removal efficiency. As shown in FIG. 5, for example, 200 gm of 5A zeolite MSD can hold about 1.6 gm of carbon dioxide at 25° C., assuming dry air contains 0.225 torr carbon dioxide. FIG. 5 is based on a similar figure in Lila M. Mulloth & John E. Finn, "Carbon Dioxide Adsorption on a 5A Zeolite Designed for CO2 Removal in Spacecraft Cabins", NASA/TM-1998-208752, 1998. Moreover, because the MSD is not specific for carbon dioxide, the relative removal efficiency of carbon dioxide will depend on the relative humidity because moisture is also readily absorbed by the MSD.

Therefore, a need exists for an enhanced method and apparatus for protecting solder joints from corrosion caused by carbon dioxide within the chip cavity of a chip module.

SUMMARY OF THE INVENTION

According to the preferred embodiments of the present invention, a chip module assembly includes a $CO_2$ getter exposed through a gas-permeable membrane to a chip cavity of a chip module. One or more chips is/are enclosed within the cavity. The $CO_2$ getter comprises a liquid composition including 1,8-diaza-bicyclo-[5,4,0]-undec-7-ene (DBU) in a solvent that includes an alcohol, preferably, 1-hexanol. In one embodiment of the present invention, a sheet of gas-permeable membrane is heat-welded to form a pillow-shaped bag in which the liquid composition is sealed. The pillow-shaped bag containing the liquid composition is preferably disposed in a recess of a heat sink and exposed to the cavity through a passage between the recess and the cavity. The $CO_2$ getter can remove a relatively large amount of carbon dioxide from the cavity, and thus effectively prevents solder joint corrosion. For example, based on the formula weights and densities of the DBU and 1-hexanol, 200 g of the liquid composition can remove over 34 g of carbon dioxide.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1. Overview

In accordance with the preferred embodiments of the present invention, a chip module assembly includes a $CO_2$ getter exposed through a gas-permeable membrane to a chip cavity of a chip module. One or more chips is/are enclosed within the cavity. The $CO_2$ getter comprises a liquid composition including 1,8-diaza-bicyclo-[5,4,0]-undec-7-ene (DBU) in a solvent that includes an alcohol, preferably, 1-hexanol. In one embodiment of the present invention, a sheet of gas-permeable membrane is heat-welded to form a pillow-shaped bag in which the liquid composition is sealed. The pillow-shaped bag containing the liquid composition is preferably disposed in a recess of a heat sink and exposed to the cavity through a passage between the recess and the cavity. The $CO_2$ getter can remove a relatively large amount of carbon dioxide from the cavity, and thus effectively prevents solder joint corrosion. For example, based on the formula weights and densities of the DBU and 1-hexanol, 200 g of the liquid composition can remove over 34 g of carbon dioxide.

2. Detailed Description

Figure 6:
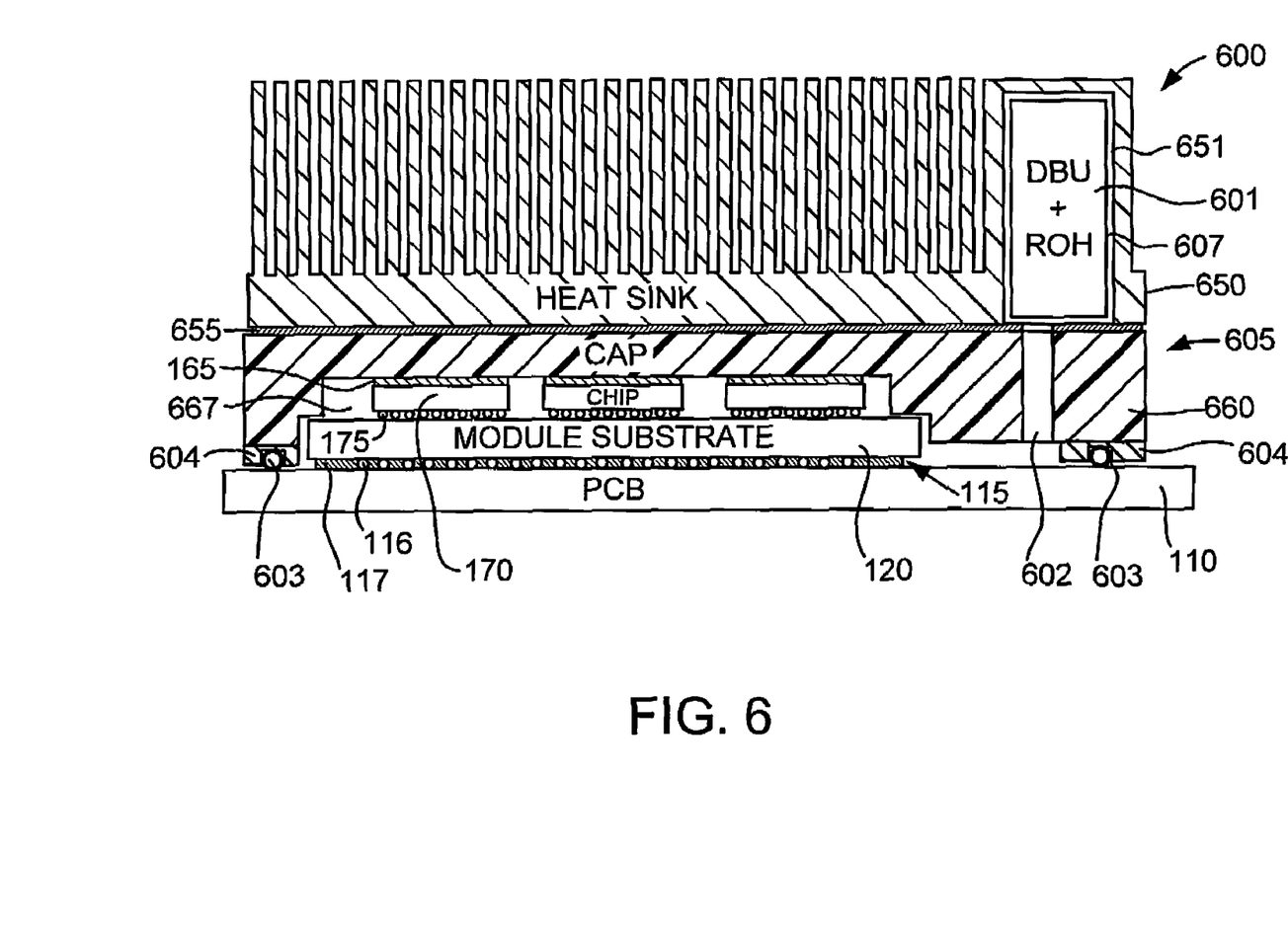
FIG. 6 is a sectional view of a multi-chip module assembly that utilizes C4 solder joints and a carbon dioxide getter according to the preferred embodiments of the present invention.

Referring now to FIG. 6, there is depicted, in a sectional view, a multi-chip module assembly 600 that utilizes a carbon dioxide getter according to the preferred embodiments of the present invention. The multi-chip module assembly 600 shown in FIG. 6 is similar to the proposed multi-chip module assembly 400 shown in FIG. 4, but the molecular sieve desiccant (MSD) 406 shown in FIG. 4 is replaced in FIG. 6 with a carbon dioxide getter 601 according to the preferred embodiments of the present invention. Alternatively, $CO_2$ getter 601 may augment rather than replace MSD 406. The multi-chip module assembly shown in FIG. 6 is exemplary. Those skilled in the art will appreciate that the methods and apparatus of the present invention can also apply to configurations differing from the multi-chip module assembly shown in FIG. 6 and apply to other types of chip modules. For example, in lieu of being applied to a capped module, such as capped module 605 shown in FIG. 6, the methods and apparatus of the present invention can also be applied to a bare die module.

Some of the elements of multi-chip module assembly 600 shown in FIG. 6 are identical to those discussed above with respect to the conventional multi-chip module assembly 100 shown in FIG. 1 and/or the proposed multi-chip module assembly 400 shown in FIG. 4. Those identical elements are discussed briefly again below, along with a detailed discussion of elements unique to the present invention.

Multi-chip module assembly 600 includes a capped module 605 electrically connected to a PCB 110. Generally, as mentioned earlier, in connecting an electronic module to a PCB, a plurality of individual electrical contacts on the base of the electronic module must be connected to a plurality of corresponding individual electrical contacts on the PCB. Various technologies well known in the art are used to electrically connect the set of contacts on the PCB and the electronic module contacts. These technologies include land grid array (LGA), ball grid array (BGA), column grid array (CGA), pin grid array (PGA), and the like. In the illustrative example shown in FIG. 6, a LGA 115 electrically connects PCB 110 to a module substrate 120. LGA 115 may comprise, for example, conductive elements 116, such as fuzz buttons, retained in a non-conductive interposer 117. One skilled in the art will appreciate, however, that any of the various other technologies may be used in lieu of, or in addition to, such LGA technology.

Preferably, as shown in FIG. 6, module 605 includes a cap 660 (i.e., module 605 is a "capped module"). In the case of a capped module, a heat sink is typically attached with a thermal interface between a bottom surface of the heat sink and a top surface of the cap, and another thermal interface between a bottom surface of the cap and a top surface of the electronic component(s). For example, as shown in FIG. 6, a heat sink 650 is attached with a thermal interface 655 between a bottom surface of heat sink 650 and a top surface of a cap 660, and another thermal interface 165 between a bottom surface of cap 160 and a top surface of each flip-chip 170. In addition, a heat spreader (not shown) may be attached to the top surface of each flip-chip 170 to expand the surface area of thermal interface 165 relative to the surface area of the flip-chip 170. The heat spreader, which is typically made of a highly thermally conductive material such as SiC, is typically adhered to the top surface of the flip-chip 170 with a thermally-conductive adhesive.

Heat sink 650 is attached to module 605 using a thermally-conductive adhesive to form thermal interface 655. Although not shown for the sake of clarity, heat sink 650 is also attached to module 605 through a conventional LGA mounting mechanism. In this regard, heat sink 650 includes a plurality of bolts or load posts (not shown) that project from the bottom surface of heat sink 650. Typically, one bolt or load post is positioned on each side of the generally square or rectangular footprint of module cavity 667. The bolts or load posts pass through correspondingly positioned throughholes (not shown) in cap 660, a non-conductive frame 604, PCB 110 and an insulated steel backup plate (not shown). As is well known in the art, the bolts or load posts cooperate with one or more compression springs (not shown) to urge assembly 600 together with force sufficient to make the electrical connections of LGA 115 and, as discussed below, to seal module cavity 667. Alternatively, those skilled in the art will recognize that other attachment mechanisms may be used. Generally, heat sinks, PCBs and the like, are attached to modules using a variety of attachment mechanisms, such as adhesives, clips, clamps, screws, bolts, barbed push-pins, load posts, and the like.

Cap 660 cooperates with various elements to seal the electronic component(s) within module cavity 667. For example, along the periphery of the bottom end of cap 660, a butyl rubber gasket 603 is seated on non-conductive frame 604 and urged against the top surface of PCB 110 by the conventional LGA mounting mechanism. Non-conductive frame 604 is also urged tightly against cap 660. This arrangement forms a seal at the bottom end of cap 660. Another seal is provided at the top end of cap 660 by thermal interface 655, which extends around and seals the periphery of a passage 602.

As mentioned above, the module may alternatively be a "bare die module" that does not include a cap. In this "bare die module" alternative case, a heat sink is attached with a thermal interface between a bottom surface of the heat sink and a top surface of each flip-chip. In addition, a heat spreader may be attached to the top surface of each flip-chip to expand the surface area of the thermal interface relative to the surface area of the flip-chip. In the "bare die module" alternative case, a non-conductive spacer frame extends between a bottom surface of the heat sink and the top surface of the PCB. Rather than being defined by surfaces of the cap, the module cavity in this alternative case would be defined by surfaces of the non-conductive spacer frame and the heat sink. A passage would pass through a portion of the non-conductive spacer frame between the module cavity and a recess in the heat sink (in a manner analogous to passage 602 in FIG. 6, which passes through cap 660 between module cavity 667 and recess 651 in heat sink 650). Also, in the "bare die module" alternative case a butyl rubber gasket would be seated along the periphery of the non-conductive spacer frame (analogous to butyl rubber gasket 603 in FIG. 6) to seal the electronic component(s) within the module cavity.

Module 605 includes C4 solder joints 175 electrically connecting each flip-chip 170 to module substrate 120. Unlike conventional multi-chip module assembly 100 shown in FIG. 1, multi-chip module assembly 600 in accordance with the preferred embodiments of the present invention does not utilize a polymeric chip underfill to protect C4 solder joints 175 from corrosion. Omitting this element is advantageous because the polymeric chip underfill renders the assembled flip-chips 170/module substrate 120 un-reworkable. The polymeric chip underfill is used in the prior art to prevent the solder balls of C4 solder joints 175 from corroding and electrically shorting neighboring solder balls. Atmospheric carbon dioxide is the primary factor controlling corrosion of the Pb-containing solder balls of C4 solder joints 175, presumably through a series of reaction steps known as the "Dutch reaction". The Dutch reaction is initiated by the oxidation of lead in the presence of $O_2$ and $H_2O$ to form lead hydroxide. Lead hydroxide and acetic acid react in two steps to form basic lead acetate. Decomposition of basic lead acetate by $CO_2$ regenerates lead acetate and $H_2O$ so the reaction can proceed again. The reaction is autocatalytic as long as $O_2$ and $CO_2$ are available. Over time, $CO_2$, $O_2$ and moisture seep into chip cavity 667. In accordance with the preferred embodiments of the present invention, $CO_2$ getter 601 is used to protect the C4 solder joints 175 from corrosion.

$CO_2$ getter 601 is exposed to module cavity 667 through a gas-permeable membrane 607 and passage 602 that extends from recess 651 in heat sink 650 to module cavity 667. As shown in FIG. 6, $CO_2$ getter 601 is directly exposed to the C4 solder joints 175 in module cavity 667. Alternatively, $CO_2$ getter 601 may be exposed, though indirectly, to the C4 solder joints 175 in an embodiment where a sealant (analogous to sealant 166 in FIG. 1) is applied between cap 660 and module substrate 120 to seal the chip cavity. In that alternative embodiment, only gas that has been treated by $CO_2$ getter 601 would be able to seep through the sealant and into the chip cavity.

$CO_2$ getter 601 comprises a liquid composition including 1,8-diaza-bicyclo-[5,4,0]-undec-7-ene (DBU) in a solvent that includes an alcohol, preferably, 1-hexanol. The liquid composition is preferably a 1:1 mixture of DBU and 1-hexanol. Although 1-hexanol is preferred, it may be possible to use other alcohols in lieu of, or in addition to, 1-hexanol.

When $CO_2$ is bubbled through the liquid composition (1:1 mixture of DBU and 1-hexanol) in a forward reaction, an ionic liquid of the DBU salt of 1-hexanol is formed. Flushing the mixture with argon, nitrogen or air in a reverse reaction reverts the ionic liquid to the non-polar solvent with concomitant loss of $CO_2$. The forward and reverse reactions are shown in Table 1 below. Both the forward and reverse reactions occur readily at room temperature, but the reverse reaction is faster at 50° C. For more information on the forward and reverse reactions, see Philip G. Jessop, David J. Heldebrant, Xiaowang Li, Charles A. Eckert, Charles L. Liotta, "Reversible nonpolar-to-polar solvent", Nature, 436, 1102 (2005), which is incorporated herein by reference.

TABLE 1

According to the preferred embodiments of the present invention, the liquid composition (1:1 mixture of DBU and 1-hexanol) is sealed in a semi-permeable membrane. Accordingly, this semi-permeable membrane must be chemically inert with respect to the liquid composition and must have high $CO_2$ permeability. In addition, it is desirable for a suitable semi-permeable membrane to have the capability of being heat-welded and sealed such that a bag of a suitable size and shape can be fabricated. An example of a suitable semi-permeable membrane for use as gas-permeable membrane 607 is BioFOLIE 25, available from Sartorius AG (Goettingen, Germany). However, any suitable semi-permeable membrane may be used.

Preferably, a sheet of gas-permeable membrane 607 is heat-welded to form a pillow-shaped bag in which about 200 g of the liquid composition is sealed. Based on the formula weights and densities of DBU and 1-hexanol (154.24 g/mole and 1.019 g/ml vs. 102.17 g/mole and 0.814 g/ml, respectively), 200 g of a 1:1 mixture of the liquid composition contains about 0.78 moles of each DBU and 1-hexanol. Therefore, since the forward reaction is equimolar with respect to carbon dioxide, 0.78 moles (34.32 g) of $CO_2$ can be removed from module cavity 667. This is greater than an order of magnitude increase over the 1.6 g of $CO_2$ that 200 g of molecular sieve desiccant (MSD) can remove. More particularly, based on these calculations, a carbon dioxide getter according to the present invention can remove more than 20× the amount of carbon dioxide from the module cavity (as compared to an equivalent weight of MSD), and thus can more effectively prevent corrosion of solder joints within the module cavity.

The pillow-shaped bag containing the liquid composition is preferably disposed in recess 651 of heat sink 650 and exposed to module cavity 667 through passage 602 between recess 651 and module cavity 667. However, $CO_2$ getter 601 may generally be disposed in any suitable location having exposure to module cavity 667. For example, $CO_2$ getter 601 may be placed directly in module cavity 667 (e.g., in spaces adjacent to and/or between flip-chips 170, or in a recess of cap 660).

Another advantage of a $CO_2$ getter according to the present invention is that the reverse reaction occurs at room temperature. Thus, according to the preferred embodiments of the present invention and as discussed in detail below with reference to FIG. 7, it is possible to regenerate a $CO_2$ getter that has been depleted due to removal of $CO_2$ from the module cavity. This is in sharp contrast to molecular sieve desiccants (MSDs), where either a vacuum or elevated temperature (200° C.) is required to desorb $CO_2$.

Figure 7:
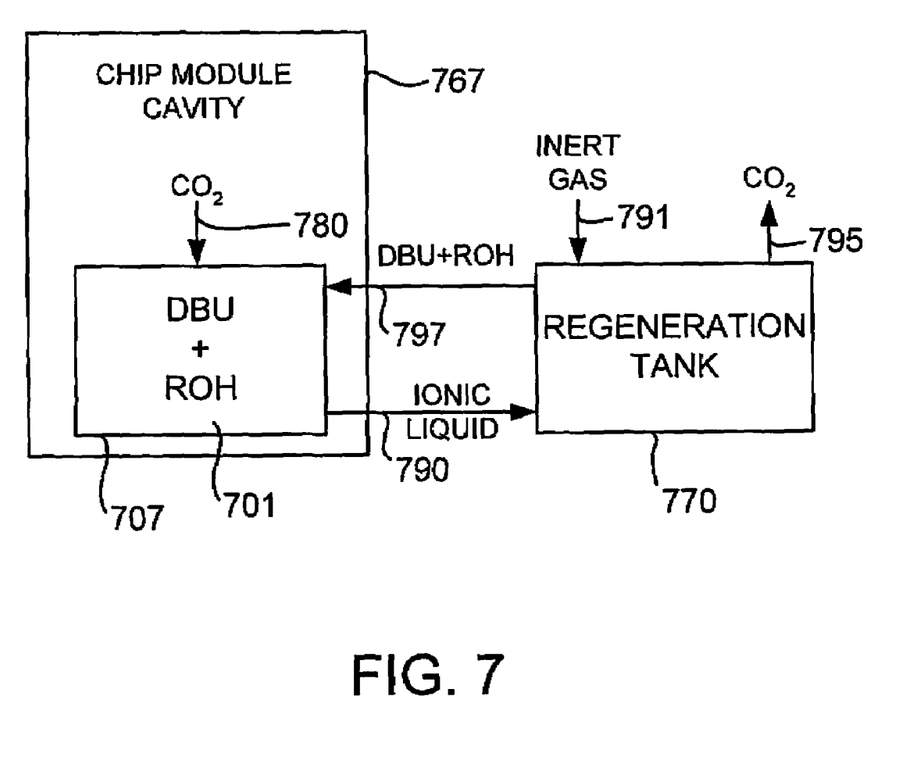
FIG. 7 is a block diagram of a carbon dioxide getter and regeneration tank according to the preferred embodiments of the present invention.

FIG. 7 illustrates, in a block diagram, a carbon dioxide getter 701 and a regeneration tank 770 according to the preferred embodiments of the present invention. $CO_2$ getter 701 comprises a liquid mixture of DBU and 1-hexanol sealed in a gas-permeable membrane 707. $CO_2$ getter 701 is exposed to carbon dioxide in a module cavity 767. Carbon dioxide enters $CO_2$ getter 701 through gas-permeable membrane 707 as represented by the arrow denoted with reference numeral 780. Within $CO_2$ getter 701, the liquid mixture (DBU and 1-hexanol) reacts with the carbon dioxide to convert the non-polar liquid mixture to an ionic liquid. After a prescribed time interval, the ionic liquid is transferred from $CO_2$ getter 701 to regeneration tank 770 through a flowline 790. Preferably, this transfer is accomplished via a pump (not shown). Inert gas (e.g., argon, nitrogen or air) enters regeneration tank 770 in a purge operation as represented by the arrow denoted with the reference numeral 791. This inert gas purge drives the reverse reaction. Carbon dioxide released during the reverse reaction is exhausted from regeneration tank 770 as represented by the arrow denoted with reference numeral 795. The regenerated non-polar liquid mixture is transferred from regeneration tank 770 to $CO_2$ getter 701 through a flowline 797. Preferably, this transfer is accomplished via a pump (not shown). Alternatively, the regeneration may take place automatically on a demand basis or manually, in lieu of being performed automatically on a time basis.

Figure 8:
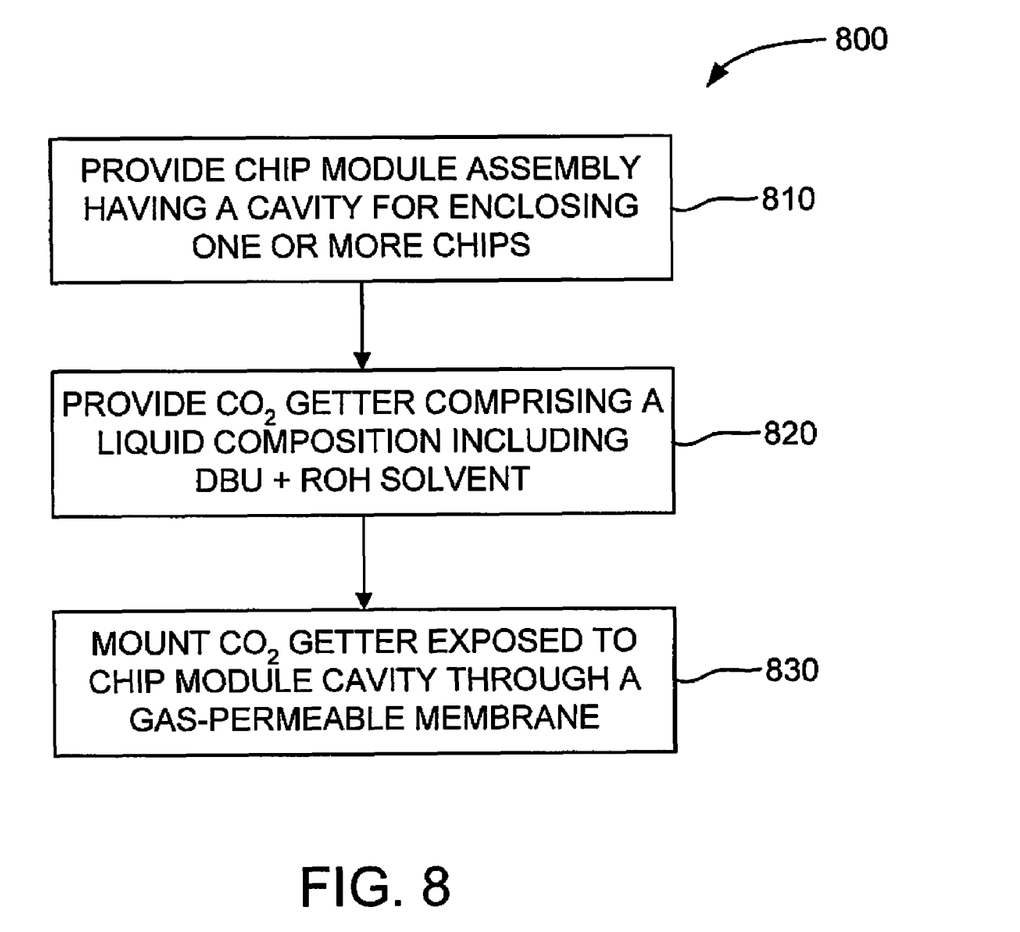
FIG. 8 is a flow chart diagram of a method for removing carbon dioxide from a chip cavity in a chip module according to the preferred embodiments of the present invention.

FIG. 8 illustrates, in a flow chart diagram, a method 800 for removing carbon dioxide from a chip cavity in a chip module according to the preferred embodiments of the present invention. Method 800 sets forth the preferred order of steps. It must be understood, however, that the various steps may occur simultaneously or at other times relative to one another. A chip module assembly is provided (step 810). One or more chips are enclosed within a cavity of the chip module assembly. In addition, a carbon dioxide getter is provided (step 820). The $CO_2$ getter comprises a liquid composition including DBU (1,8-diaza-bicyclo-[5,4,0]-undec-7-ene) in a solvent that includes an alcohol, preferably, 1-hexanol. Preferably, the $CO_2$ getter comprises a housing fabricated from one or more sheets of gas-permeable membrane heat-welded to form a pillow-shaped bag in which the liquid composition is sealed. The $CO_2$ getter is then mounted relative to the chip module assembly so that the $CO_2$ getter is exposed to the cavity through a gas-permeable membrane (step 830). For example, with reference to FIG. 6, $CO_2$ getter 601 housed in gas-permeable membrane 607 is placed in a recess 651 of heat sink 650, and then the LGA mechanism is actuated to seal the module cavity 667. Preferably, this sealing operation is performed in an inert gas (e.g., nitrogen) environment so as to minimize the amount of carbon dioxide in the module cavity.

One skilled in the art will appreciate that many variations are possible within the scope of the present invention. For example, the methods and apparatus of the present invention can also apply to configurations differing from the multi-chip module assembly shown in FIG. 6 and apply to other types of chip modules. For example, in lieu of being applied to a capped module, such as capped module 605 shown in FIG. 6, the methods and apparatus of the present invention can also be applied to a bare die module. Likewise, in lieu of being applied to C4 solder joints, such as C4 solder joints 175 shown in FIG. 6, the methods and apparatus of the present invention can also be applied to protect other types of connections from corrosion caused by carbon dioxide. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A method for removing carbon dioxide from a cavity in a chip module assembly, comprising the steps of:
   providing a chip module assembly enclosing at least one chip within a cavity;
   providing a carbon dioxide getter comprising a liquid composition including 1.8-diaza-bicyclo-[5.4.0]-undec-7-ene in a solvent that includes 1-hexanol;
   mounting the carbon dioxide getter relative to the chip module assembly so that the carbon dioxide getter is exposed, directly or indirectly, to the cavity through a gas-permeable membrane;
   providing a regeneration tank, wherein the regeneration tank is in fluid communication with the carbon dioxide getter via one or more flowlines;
   transferring an ionic liquid reaction product generated within the carbon dioxide getter to the regeneration tank via at least one of the one or more flowlines;
   reacting, in the regeneration tank, the ionic liquid reaction product and an inert gas to regenerate the getter liquid composition;
   returning the regenerated getter liquid composition from the regeneration tank to the carbon dioxide getter via at least one of the one or more flowlines.

2. The method as recited in claim 1, wherein the ionic liquid reaction product generated within the carbon dioxide getter is a reaction product of the getter liquid composition and gaseous carbon dioxide that enters the carbon dioxide getter through the gas-permeable membrane.

3. The method as recited in claim 2, wherein the step of transferring the ionic liquid reaction product generated within the carbon dioxide getter is performed automatically on a time basis.

4. The method as recited in claim 2, wherein the step of transferring the ionic liquid reaction product generated within the carbon dioxide getter is performed automatically on a demand basis.

5. A method for removing carbon dioxide from a cavity in a chip module assembly, comprising the steps of:
   providing a chip module assembly enclosing at least one chip within a cavity;
   providing a carbon dioxide getter comprising a liquid composition including 1.8-diaza-bicyclo-[5.4.0]-undec-7-ene in a solvent that includes an alcohol;
   mounting the carbon dioxide getter relative to the chip module assembly so that the carbon dioxide getter is exposed, directly or indirectly, to the cavity through a gas-permeable membrane;
   providing a regeneration tank, wherein the regeneration tank is in fluid communication with the carbon dioxide getter via one or more flowlines;
   transferring an ionic liquid reaction product generated within the carbon dioxide getter to the regeneration tank via at least one of the one or more flowlines;
   reacting, in the regeneration tank, the ionic liquid reaction product and an inert gas to regenerate the getter liquid composition;
   returning the regenerated getter liquid composition from the regeneration tank to the carbon dioxide getter via at least one of the one or more flowlines.

6. The method as recited in claim 5, wherein the ionic liquid reaction product generated within the carbon dioxide getter is a reaction product of the getter liquid composition and gaseous carbon dioxide that enters the carbon dioxide getter through the gas-permeable membrane.

7. The method as recited in claim 6, wherein the step of transferring the ionic liquid reaction product generated within the carbon dioxide getter is performed automatically on a time basis.

8. The method as recited in claim 6, wherein the step of transferring the ionic liquid reaction product generated within the carbon dioxide getter is performed automatically on a demand basis.

\* \* \* \* \*